(12) United States Patent
Hinterscher

(10) Patent No.: US 7,315,183 B2
(45) Date of Patent: Jan. 1, 2008

(54) SINGLE-SUPPLY VOLTAGE TRANSLATOR INPUT HAVING LOW SUPPLY CURRENT

(75) Inventor: Gene B. Hinterscher, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 301 days.

(21) Appl. No.: 10/995,744

(22) Filed: Nov. 22, 2004

(65) Prior Publication Data
US 2006/0109030 A1 May 25, 2006

(51) Int. Cl.
H03K 19/0175 (2006.01)
(52) U.S. Cl. .............................. 326/81; 326/83; 326/68
(58) Field of Classification Search .................. 326/68, 326/81, 83
See application file for complete search history.

(56) References Cited

U.S. PATENT DOCUMENTS 5,079,439 A * 1/1992 Wanlass ...................... 327/333
5,910,734 A * 6/1999 Manning ...................... 326/81
6,127,848 A * 10/2000 Wert et al. .................... 326/81
6,265,896 B1 * 7/2001 Podlesny et al. ............. 326/80
6,424,173 B1 * 7/2002 Vannorsdel ................... 326/68

* cited by examiner

Primary Examiner—Vibol Tan
(74) Attorney, Agent, or Firm—W. James Brady; Frederick J. Telecky, Jr.

(57) ABSTRACT

A voltage translator circuit is disclosed herein that eliminates the need for two supply voltages to achieve voltage translation through the use of supplying a shifted voltage threshold. Effectively, this voltage translator circuit has very little supply current (Icc) after the device switches. Specifically, the voltage translator in accordance with the present invention includes a first and second inverter coupled in series between an input node and an output node. A third inverter connects between the output node and a fourth inverter. A first circuit portion that establishes the low-to-high switching point connects between the fourth inverter and the first inverter. A second circuit portion connects between the fourth and first inverter that will block the switching current from draining the voltage supply after the transition from low-to-high has occurred. This solution addresses the increase in supply current (delta Icc) for each input that is at one of the specified TTL voltage levels rather than GND or VCC while having just one supply voltage.

12 Claims, 3 Drawing Sheets

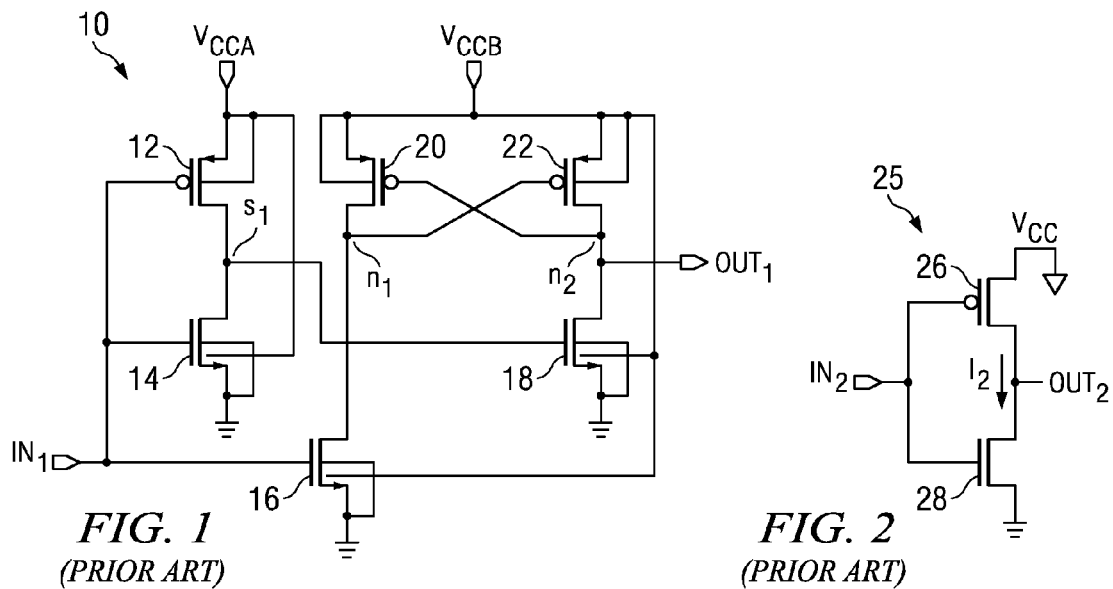
FIG. 1
*(PRIOR ART)*
FIG. 2
*(PRIOR ART)*
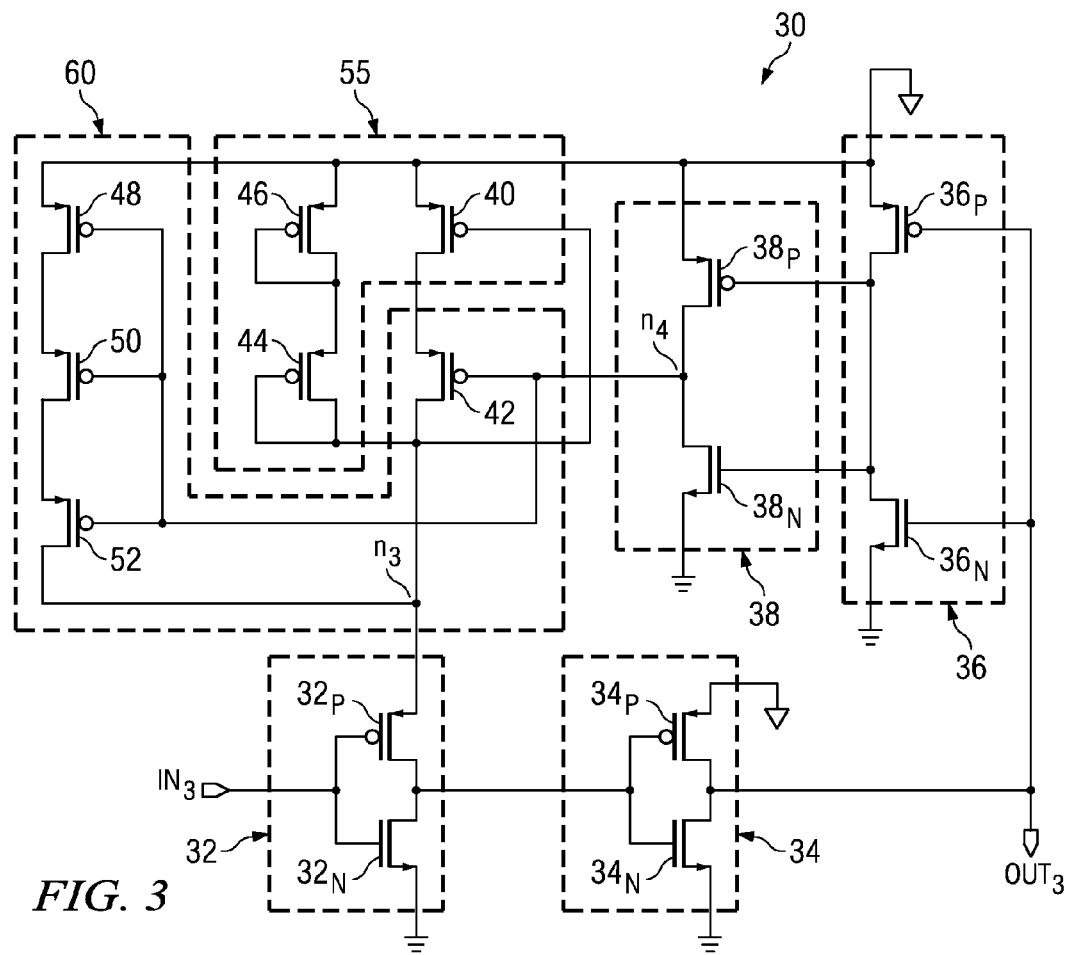
FIG. 3 in US 7,315,183 B2

SINGLE-SUPPLY VOLTAGE TRANSLATOR INPUT HAVING LOW SUPPLY CURRENT

FIELD OF THE INVENTION

The present invention relates to voltage translators and, more particularly, a voltage translator having one power supply that limits the supply current within the voltage translator.

BACKGROUND OF THE INVENTION

A current trend in portable electronic devices is to focus upon conserving power through lowering the operating voltage of the electronic devices. When the operating voltage of an electronic device is lowered, however, there tends to be an increase in device failures due to the instability of the memory within the electronic device. Many electronic device designs compensate for the lowered operating voltage by incorporating embedded processors having different voltage domains that allow different components to operate at different voltage potentials.

In an effort to provide a means for these embedded processors to communicate with each other, voltage translator circuits interface between these components for translating one voltage potential to another voltage potential. A voltage translator circuit translates one input voltage level to a different output voltage level. This voltage translator circuit usually needs a supply voltage for the input circuitry ($V_{CCA}$) and a different output supply voltage for output circuitry ($V_{CCB}$). Specifically, a processor core in a notebook computer may include separate memories, I/O buffer devices, and arithmetic processing logic each having different voltage domains. Each of these separate components may use voltage translator circuits to expedite translation between the voltage digital interfaces. Thereby, each voltage translator circuit is an intermediary circuit formed between a low voltage integrated logic circuit and a high voltage integrated logic circuit located in the various voltage domains.

Generally, a voltage translator circuit provided within a mixed voltage integrated circuit is a mixed voltage integrated circuit having at least two different voltages associated with two different corresponding power supplies. In particular, there may exist a lower voltage that is associated with the core logic and a higher voltage that is associated with the output circuitry. A known voltage translator circuit of this type is shown in FIG. 1.

Two power supplies in the voltage translator design are generally used to manage the difference in supply voltage and input TTL voltage levels on the pin of the device. Without two supplies, there will be an increase in supply current ΔIcc for each input operating at one of the specified TTL voltage levels rather than ground $G_{ND}$ or the power supply voltage level $V_{CC}$. The change in supply current $\Delta I_{CC}$ represents the supply current change wherein an increase in supply current for each input that is at one of the specified TTL voltage levels rather than 0V or $V_{CC}$ exists.

FIG. 4 shows a performance of a known voltage translator of FIG. 1 wherein the power supply voltage $V_{CC}$ equals 3.6V. The dashed lines represent the supply current. Region $A_1$ illustrates the high to low transition of the input voltage. Prior to the high to low transition, supply current is present in substantial amounts. Region $B_1$ represents when specific voltages transition from low to high. As shown, after the low-to-high transition, large amounts of supply current are present. This type of input cannot satisfy an input TTL voltage level of 1.2V~3.6V while having a supply voltage of 2.3V~3.6V without producing a large supply current after the input switches.

In the alternative, a known voltage translator, having only one power supply voltage reference, as shown in FIG. 2 results in having both transistors 26 and 28 on when the voltage at the input $In_2$ is applied. As a result, a large amount of supply current $I_2$ exists causing a large amount of power dissipation. Furthermore, the battery or power supply will be consumed quickly. Thus, in an effort to eliminate the large amount of supply current that exists in a one power supply voltage translator, a voltage translator, having two power supplies, is commonly used that enables the voltage translator to go from one voltage to another without drawing a large amount of supply current. In addition, voltage translator solutions having two supplies are utilized to help manage the difference in supply voltage and input TTL voltage levels on the pin of the device. Without two supplies, there tends to be an increase in supply current $\Delta I_{CC}$ for each input that is at one of the specified TTL voltage levels rather than ground GND or the maximum power supply voltage level $V_{CC}$.

Thus, there is a need for a voltage translator having one supply voltage that achieve voltage translation that eliminates supply current or solves the supply current problem.

The present invention is directed to overcoming, or at least reducing the effects of one or more of the problems set forth above.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

To address the above-discussed deficiencies of voltage translators, the present invention teaches a voltage translator having low supply current that includes one power supply. Specifically, the voltage translator in accordance with the present invention includes a first and second inverter coupled in series between an input node and an output node. A third inverter connects between the output node and a fourth inverter. A first circuit portion that establishes the low-to-high switching point connects between the fourth inverter and the first inverter. A second circuit portion connects between the fourth and first inverter to block the supply current from draining the voltage supply after the transition from low-to-high has occurred.

More particularly, the first circuit portion may comprise a first p-channel transistor that connects between the voltage supply and the fourth inverter, wherein the fourth inverter biases the first p-channel transistor. A second p-channel diode configured transistor connects between the voltage supply and a fifth node. A third p-channel transistor connects between the fifth node and the first inverter, wherein the third p-channel transistor is biased by the first inverter.

The second circuit portion may include four p-channel transistors. A first p-channel transistor connects between a fourth node and the first inverter, wherein the first p-channel transistor is biased by the fourth inverter. A second p-channel transistor connects between the voltage supply and a fifth node, wherein the second p-channel transistor is biased by the fourth inverter. A third p-channel transistor connects between the fifth node and a sixth node. The third p-channel transistor is also biased by the fourth inverter.

The advantages of this solution is that it eliminates the need for two supply voltages to achieve voltage translation by supplying a shifted voltage threshold while maintaining very little supply current after the device switches. In addition, this solution addresses the increase in supply current for each input that is at one of the specified TTL voltage levels rather than $G_{ND}$ or $V_{CC}$ when a voltage translator includes one supply voltage.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein:

FIG. 1 is a known voltage translator having two power supplies;

FIG. 2 illustrates a known voltage translator having one power supply;

FIG. 3 displays the voltage translator circuit in accordance with the present invention;

DETAILED DESCRIPTION OF PREFERRED EMBODIMENTS

Figure 4:
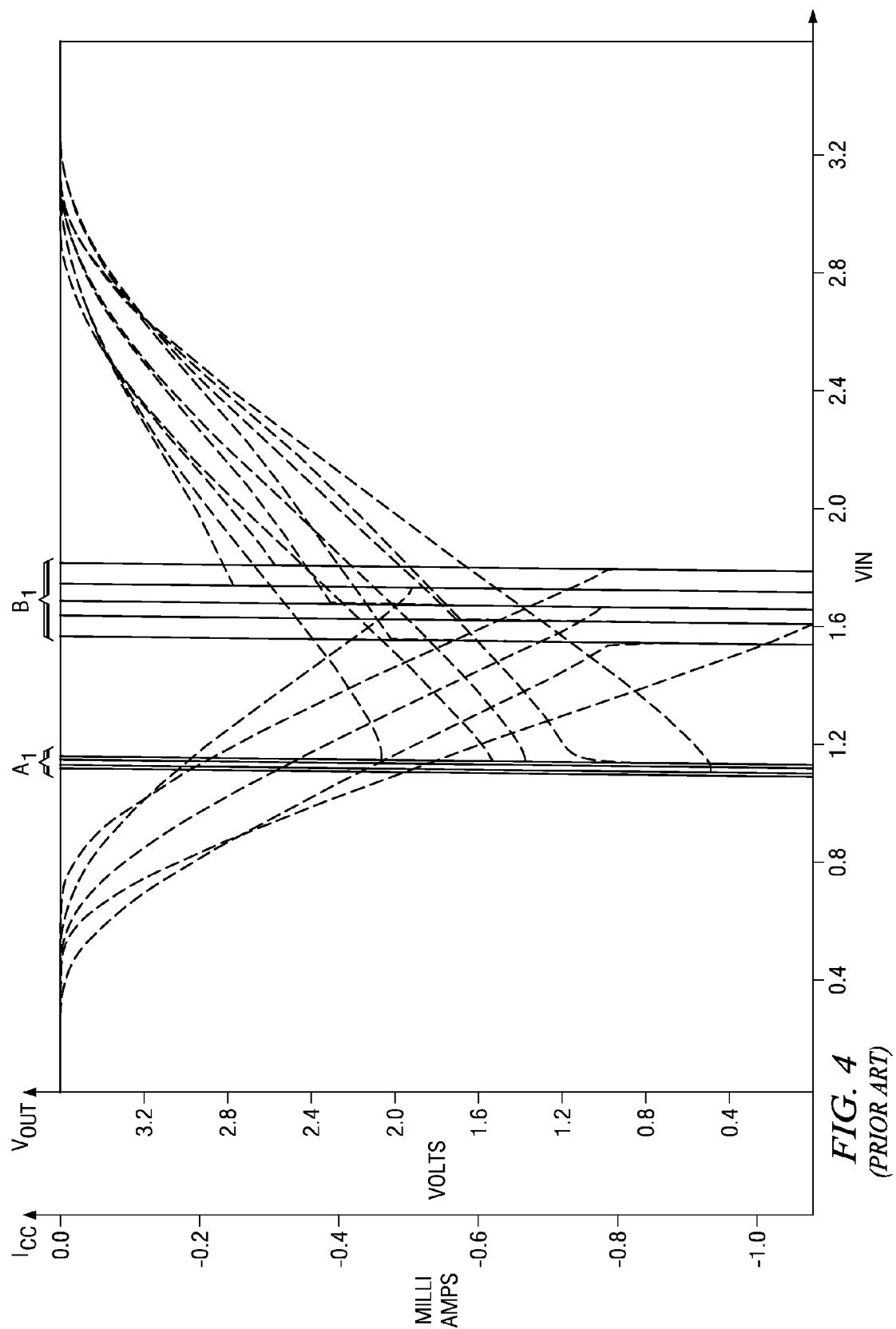
FIG. 4 illustrates the diagram of know voltage translator input and output voltage comparison.

One or more exemplary implementations of the present invention will now be described with reference to the attached drawings, wherein like reference numerals are used to refer to like elements throughout. The various aspects of the invention are illustrated below in a high voltage level shifter, although the invention and the appended claims are not limited to the illustrated examples.

The present invention is best understood by comparison with a known voltage translator. Hence, this detailed description begins with a discussion of known voltage translator as is shown in FIG. 1. This voltage translator 10 includes two power supplies, $V_{CCA}$ and $V_{CCB}$, wherein the first power supply voltage $V_{CCA}$ is 1.2V and the second power supply voltage $V_{CCB}$ is 3.6V. When 1.2V is applied at the input $IN_1$, voltage translator 10 presents a 3.6V signal at the output $Out_1$. Having two power supplies, enables voltage translator 10 to go from one voltage to the another without drawing a lot of supply current $I_{CC}$.

Specifically, when input $IN_1$ is low, p-channel device 12 is on. In addition, n-channel devices, 14 and 16, are off. Signal $s_1$ is high at 1.2V causing transistor 18 to turn on which makes the output $Out_1$ low. Since node $n_2$ is low, transistor 20 turns on. Accordingly, transistor 22 turns off because the signal at node $n_1$ is high at 3.6V.

When input $IN_1$ is high at 1.2V, transistor 12 is off; while transistors, 14 and 16, are on. As such, signal $s_1$ is low at 0V which causes transistor 18 to turn off. Transistor 22 turns on since the signal at the node $n_1$ is low. Accordingly, the signal at output $Out_1$ transitions to 3.6V or the second power supply level $V_{CCB}$. As a result of output $Out_1$ going high at 3.6V, transistor 20 is turned off. Thereby, when 1.2V is input at the input node $IN_1$, the voltage translator provides 3.6V on the output $Out_1$. Thus, voltage translator circuit 10 translates from a 1.2V level to a 3.6V level.

Figure 5:
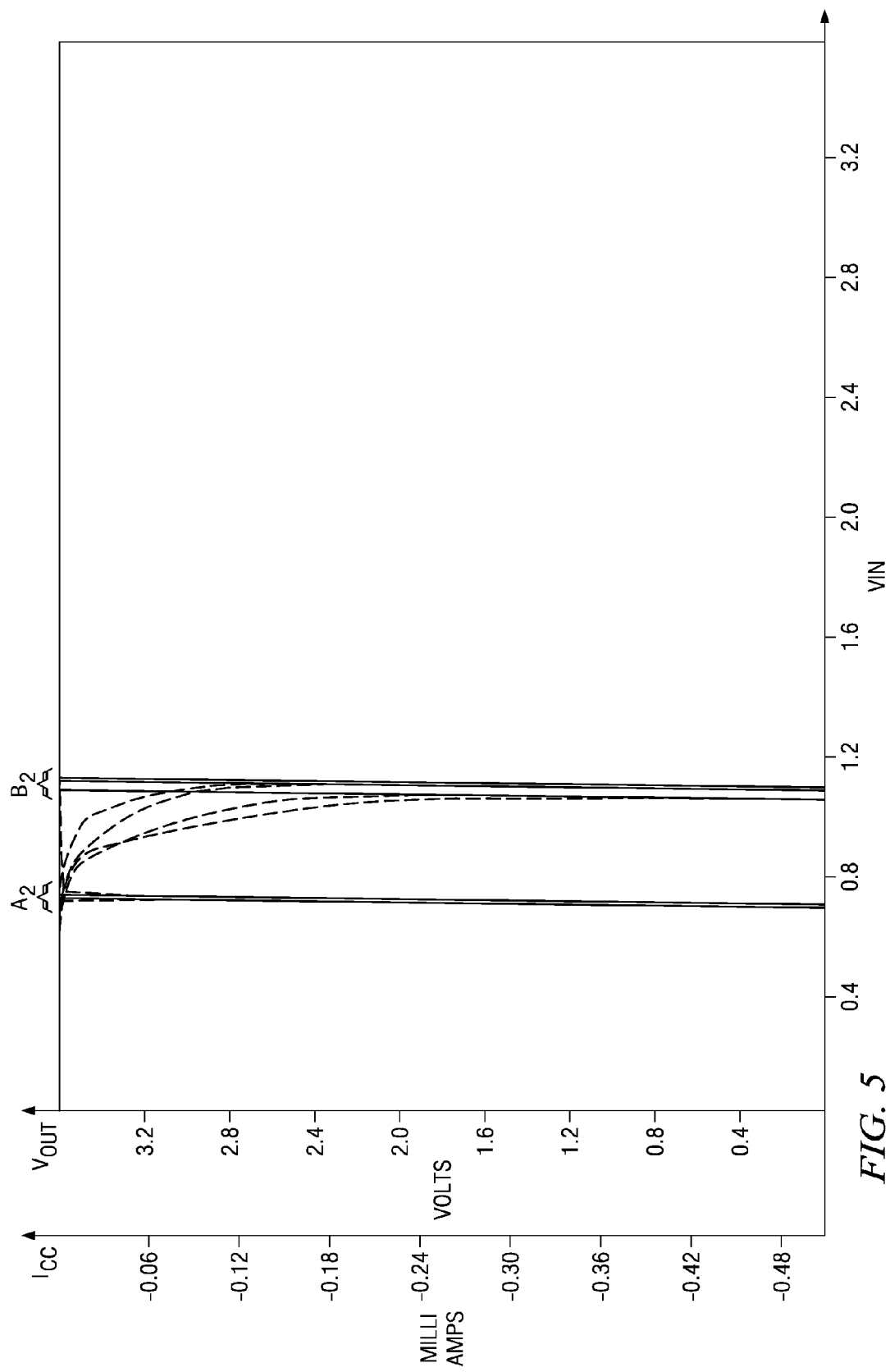
FIG. 5 shows the diagram of the voltage translator input and output voltage comparison in accordance with the present invention shown in FIG. 3.

Illustrated in FIG. 3 is voltage translator circuit 30 in accordance with the present invention. Input node IN3 connects to bias transistors, 32p and 32n, which form a first inverter 32. These transistors, 32p and 32n, control the switching thresholds of the high-to-low transition. Transistors, 34p and 34n, form a second inverter 34, wherein inverters, 32 and 34, act as buffers for the next stage external to the output node $Out_3$. Transistors, 36p and 36n, form a third inverter 36 that connects to the output node $Out_3$. Transistors, 38p and 38n, form a fourth inverter 38. A first circuit portion 55 includes transistors, 40, 44, and 46. The first circuit portion 55 controls the switching threshold of the low-to-high transition. A second circuit portion 60 blocks switching current from draining the voltage supply after the transition from low-to-high has occurred. The second circuit portion 60 includes transistors, 42, 48, 50, and 52. Inverters, 36 and 38, control the gates of transistors, 42, 48, 50, and 52, within the second circuit portion 60. As the input voltage $IN_3$ is ramped from low-to-high, the size of each P-channel transistors, 40, 44, and 46, within the first circuit portion establish the low-to-high switching point $B_2$ as is illustrated in FIG. 5, wherein FIG. 5 shows the performance of voltage translator 30 where the input $IN_3$ equals 1.2V and the power supply voltage $V_{CC}$ equals 3.6V. The dashed lines in FIG. 5 illustrate the switching currents and the solid lines represent the voltage thresholds. Within the second circuit portion 60, transistor 42, turns off the supply current after switching. Transistors 48, 50, and 52 adjust node $n_3$ to the supply voltage level $V_{CC}$.

Transistors, 44 and 46, are coupled in diode fashion wherein each gate is connected to its respective source. Through the use of connecting transistors 40, 44 and 46 in diode configuration, a low-to-high switching point is established even with a high supply voltage at 3.6 v. This configuration helps to achieve a narrow switching voltage over process and temperature change. As soon as the circuit 30 switches from the low-to-high state, inverters, 36 and 38, turn off the transistors, 42, 48, 50, and 52 in the second circuit portion 60. As a result, most of the supply current $I_{CC}$ is eliminated from voltage translator 30 for the remaining duration of the low-to-high transition. By achieving a low switching point and eliminating the supply current after switching occurs, this novel configuration can satisfy an input TTL voltage level of 1.2V~3.6V while having a supply voltage of 2.3V~3.6V without producing a large supply current $\Delta I_{CC}$.

More particularly, in operation when input voltage $IN_3$ goes from low to high, transistor 32n turns on transistor 32p turns off. As a result, transistor 34p turns on and 36n turns on. Moreover, transistor 38p turns on and pulls node $n_4$ high. Accordingly, when node $n_4$ is high, the transistors, 42, 48, 50, and 52 of the second circuit portion 60 turn off. Finally, as a result, since transistors, 42, 48, 50, and 52 are turned off, the current path to $V_{CC}$ is eliminated.

In the alternative, as the input voltage $IN_3$ is ramped from a high-to-low, transistors, $32_p$ and $32_n$, are adjusted to have a voltage threshold switch point lower than the low-to-high voltage threshold switch point. This achieves a hysteresis effect to the circuit 30. After the high-to-low transition is complete, N-channel device $32_n$ is almost completely "off,"

which is a condition that allows very little supply current. Thereby, the current path to $V_{CC}$ is eliminated after the high-to-low transition.

Thus, the voltage translator 30 in accordance with the present invention eliminates the need for two supply voltages by supplying a shifted voltage threshold and having very little supply current $\Delta I_{CC}$ after the device switches. This solution was designed to handle an input TTL voltage level of 1.2V~3.6V while having a supply voltage of 2.3V~3.6V without producing a large supply current $\Delta I_{CC}$. This voltage translator design has a lower dynamic power dissipation since little supply current $I_{CC}$ exists after the device switches. This voltage translator helps to achieve narrow switching voltages over process and temperature change, as illustrated in FIG. 5. Notice in comparison to the diagram of FIG. 4, the two regions where there was substantial supply current $\Delta I_{CC}$ have been eliminated in FIG. 5.

Specifically, as previously presented, FIG. 4 shows a performance of the known voltage translator of FIG. 1 having low supply current, wherein the power supply voltage $V_{CC}$ equals 3.6V. The dashed lines represent the supply current. Region $A_1$ illustrates the high to low transition of the input voltage. Prior to the high to low transition, supply current is present in substantial amounts. Region $B_1$ represents when specific voltages transition from low to high. After the low to high transition, large amounts of supply current are present. The region between regions $A_1$ and $B_1$ is known as the hysteresis region. In general, supply current should be present within this region as is shown in FIG. 4. This voltage translator configuration, however, cannot satisfy an input TTL voltage level of 1.2V~3.6V while having a supply voltage of 2.3V~3.6V without producing a large supply current $\Delta I_{CC}$.

As shown in FIG. 5, however, the supply current has been eliminated prior to the high-to-low transition and after the low-to-high transition. Particularly, there is current in the hysteresis region but there is no current before the high-to-low transition or after the low-to-high transition. The voltage translator of FIG. 3 is designed to operate having an input TTL voltage level of 1.2V to 3.6V and provide an output voltage of 2.3V to 3.6V. Specifically, an input TTL voltage level of 2.3 V may be applied to the input $IN_3$. Thereby, the input $IN_3$ will provide a translated voltage of 3.6 V at the output while extending the delta supply current $\Delta I_{CC}$ range. The table below illustrates the design specifications with respect to the change in supply current $\Delta I_{CC}$:

| $\Delta I_{CC}$ | One input at 0.3 V or 1.1 V. Other inputs at 0 or $V_{CC}$. | $I_0 = 0$ | 2.3 V to 2.7 V | 4 | µA |
|---|---|---|---|---|---|
| | One input at 0.45 V or 1.2 V. Other inputs at 0 or $V_{CC}$. | $I_0 = 0$ | 2.3 V to 2.7 V 3 V to 3.6 V | 4 | |

Advantages of the voltage translator in accordance with the present invention include, but are not limited to, a voltage translator having low supply current that includes one power supply. This voltage translator eliminates the need for two supply voltages by supplying a shifted voltage threshold and having very little supply current $\Delta I_{CC}$ after the device switches. This solution was designed to handle an input TTL voltage level of 1.2V~3.6V while having a supply voltage of 2.3V~3.6V without producing a large supply current $\Delta I_{CC}$. This voltage translator design has a lower dynamic power dissipation since little supply current Icc exists after the device switches. In addition, this voltage translator helps to achieve narrow switching voltages over process and temperature change.

While the principles of the present invention have been demonstrated with particular regard to the structures and methods disclosed herein, it will be recognized that various departures may be undertaken in the practice of the invention. The scope of the invention is not intended to be limited to the particular structures and methods disclosed herein, but should instead be gauged by the breadth of the claims that follow.

Those of skill in the art will recognize that the physical location of the elements illustrated in FIG. 3 can be moved or relocated while retaining the function described above.

The reader's attention is directed to all papers and documents which are filed concurrently with this specification and which are open to public inspection with this specification, and the contents of all such papers and documents are incorporated herein by reference.

All the features disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. A voltage translator connected between a first component having a first voltage supply and a second component having a second voltage supply, wherein the first voltage supply differs from the second voltage supply, the voltage translator couples to supply an operating output voltage for the second component, comprising:
    a first inverter coupled between the input and a first node;
    a second inverter coupled between the first node and an output node;
    a third inverter coupled between the output node and a second node;
    a fourth inverter coupled between the second node and a third node;
    a first circuit portion coupled between the fourth inverter and first inverter that establishes the low-to-high switching point; and
    a second circuit portion coupled between the fourth inverter and the first inverter that blocks switching current from draining the second voltage supply after the transition from low-to-high has occurred.

2. The voltage translator of claim 1, wherein the first circuit portion comprises:
    a first p-channel transistor coupled between the second voltage supply and a fourth node, the first p-channel transistor biased by the first node;
    a second p-channel transistor coupled between the second voltage supply and a fifth node, the second p-channel transistor biased by the fifth node; and
    a third p-channel transistor coupled between the fifth node and the first node, the third p-channel transistor biased by the first node.

3. The voltage translator of claim 1, wherein the second circuit portion comprises:

a first p-channel transistor coupled between a fourth node and the first node, the first p-channel transistor biased by the third node;

a second p-channel transistor coupled between the second voltage supply and a fifth node, the second p-channel transistor biased by the third node;

a third p-channel transistor coupled between the fifth node and a sixth node, the third p-channel transistor biased by the third node; and an fourth p-channel transistor coupled between the sixth node and a seventh node, the fourth p-channel transistor biased by the third node.

4. The voltage translator of claim 1, wherein the first inverter comprises:

an first p-channel transistor coupled between the first node and the second node, the first p-channel transistor biased by the input signal; and a first n-channel transistor coupled between the second node and ground, the first n-channel transistor biased by the input signal.

5. The voltage translator of claim 1, wherein the second inverter comprises:

an first p-channel transistor coupled between the second voltage supply and the output node, the first p-channel transistor biased by the first node; and a first n-channel transistor coupled between the output node and ground, the first n-channel transistor biased by the first node.

6. The voltage translator of claim 1, wherein the third inverter comprises:

an first p-channel transistor coupled between the second voltage supply and the third node, the first p-channel transistor biased by the output node; and a first n-channel transistor coupled between the third node and ground, the first n-channel transistor biased by the output node.

7. The voltage translator of claim 1, wherein the fourth inverter comprises:

an first p-channel transistor coupled between the second voltage supply and the fourth node, the first p-channel transistor biased by the third node; and a first n-channel transistor coupled between the fourth node and ground, the first n-channel transistor biased by the third node.

8. The voltage translator of claim 1, wherein the input signal is at a voltage level at a value from 1.2 volts to 3.6 volts.

9. The voltage translator of claim 1, wherein the output node provides the output operating voltage at a value from 2.3 volts to 3.6 volts.

10. A voltage translator connected between a first component having a first voltage supply and a second component having a second voltage supply, wherein the first voltage supply differs from the second voltage supply, the voltage translator couples to supply an operating output voltage for the second component, comprising:

a first p-channel transistor coupled between a first node and a second node, the first p-channel transistor biased by a signal from the first component;

a first n-channel transistor coupled between the second node and ground, the first n-channel transistor biased by the signal from the first component;

a second p-channel transistor coupled between the second voltage supply and a third node, the second p-channel transistor biased by the second node;

a second n-channel transistor coupled between the third node and ground, the second n-channel transistor biased by the second node;

a third p-channel transistor coupled between the second voltage supply and a fourth node, the third p-channel transistor biased by the third node, wherein the third node provides the operating output voltage;

a third n-channel transistor coupled between the fourth node and ground, the third n-channel transistor biased by the third node;

a fourth p-channel transistor coupled between the second voltage supply and a fifth node, the fourth p-channel transistor biased by the fourth node;

a fourth n-channel transistor coupled between the fifth node and ground, the fourth n-channel transistor biased by the fourth node;

a fifth p-channel transistor coupled between the second voltage supply and a sixth node, the fifth p-channel transistor biased by the first node;

a sixth p-channel transistor coupled between the sixth node and the first node, the sixth p-channel transistor biased by the fifth node;

a seventh p-channel transistor coupled between the second voltage supply and a seventh node, the seventh p-channel transistor biased by the seventh node;

an eight p-channel transistor coupled between the seventh node and the first node, the eight p-channel transistor biased by the first node;

a ninth p-channel transistor coupled between the second voltage supply and a eight node, the ninth p-channel transistor biased by the fifth node;

a tenth p-channel transistor coupled between the eight node and a ninth node, the tenth p-channel transistor biased by the fifth node; and an eleventh p-channel transistor coupled between the ninth node and a first node, the eleventh p-channel transistor biased by the fifth node.

11. The voltage translator of claim 10, wherein the input signal is at a voltage level at a value from 1.2 volts to 3.6 volts.

12. The voltage translator of claim 10, wherein the output node provides the output operating voltage at a value from 2.3 volts to 3.6 volts.

* * * * *